United States Patent
Fujiwara et al.

(10) Patent No.: US 7,864,017 B2
(45) Date of Patent: Jan. 4, 2011

(54) THIN-FILM MAGNETIC DEVICE, AND ELECTRONIC COMPONENT MODULE HAVING SAME

(75) Inventors: Toshiyasu Fujiwara, Tokyo (JP); Kyung-Ku Choi, Tokyo (JP)

(73) Assignee: TDK Corporation, Tokyo (JP)

( * ) Notice: Subject to any disclaimer, the term of this patent is extended or adjusted under 35 U.S.C. 154(b) by 130 days.

(21) Appl. No.: 12/033,422

(22) Filed: Feb. 19, 2008

(65) Prior Publication Data
US 2008/0198560 A1    Aug. 21, 2008

(30) Foreign Application Priority Data
Feb. 20, 2007    (JP) .......................... P2007-039357

(51) Int. Cl.
*H01F 5/00*    (2006.01)
(52) U.S. Cl. ..................................... 336/200
(58) Field of Classification Search ................... 336/65, 336/83, 84 R, 84 M, 200, 206–208, 232–234
See application file for complete search history.

(56) References Cited

U.S. PATENT DOCUMENTS 3,210,707 A * 10/1965 Constantakes .............. 336/200
5,070,317 A * 12/1991 Bhagat ...................... 336/200
2009/0085711 A1* 4/2009 Iwasaki ...................... 336/234

FOREIGN PATENT DOCUMENTS

| JP | A 05-021243 | | 1/1993 |
| JP | 06224043 A | * | 8/1994 |
| JP | 11224817 A | * | 8/1999 |
| JP | B2 31354941 | | 12/2000 |
| JP | 2001267129 A | * | 9/2001 |
| JP | A 2004-274004 | | 9/2004 |

* cited by examiner

*Primary Examiner*—Tuyen Nguyen
(74) *Attorney, Agent, or Firm*—Oliff & Berridge, PLC

(57) ABSTRACT

It is an object of the present invention to provide an electronic component module with which circuit malfunction can be adequately prevented. There are provided a base having wiring, and a thin-film magnetic device provided on one side of the base. The thin-film magnetic device comprises a first magnetic film disposed facing the base, a second magnetic film disposed on the opposite side of the first magnetic film with respect to the base, and a thin-film coil wound so as to encircle the second magnetic film a plurality of times. The thin-film coil has a plurality of first conductor pattern components provided between the first and second magnetic films, a plurality of second conductor pattern components provided on the opposite side of the second magnetic film with respect to the first magnetic film, and a plurality of connecting conductors that connect the first conductor pattern components and the second conductor pattern components in series. The relative magnetic permeability of the second magnetic film is greater than the relative magnetic permeability of the first magnetic film.

4 Claims, 5 Drawing Sheets

THIN-FILM MAGNETIC DEVICE, AND ELECTRONIC COMPONENT MODULE HAVING SAME

BACKGROUND OF THE INVENTION

1. Field of the Invention

The present invention relates to a thin-film magnetic device, and to an electronic component module having said thin-film magnetic device and a base with wiring.

2. Related Background Art

Electronic devices such as personal computers and mobile telephones have electronic components such as integrated circuits or passive devices such as inductors and capacitors. As electronic devices have become smaller and lighter in recent years, there has been a need for these electronic components to be smaller and shorter in height as well. To meet this need, electronic component have come to be formed using thin-film formation technology. This is led to the use of products (hereinafter referred to as electronic component modules) in which a base having wiring is integrated with a thin-film magnetic device such as a thin-film inductor or a thin-film transistor (see, for example, Japanese Laid-Open Patent Application No. 2004-274004).

An example of a known thin-film magnetic device is one equipped with a solenoid coil wound a plurality of times so as to encircle an upper magnetic film, and a lower magnetic film provided facing the upper magnetic film and with part of the solenoid coil interposed therebetween (see, for example, Japanese Patent No. 3135941). Reduction of leakage of magnetic flux and improvement of inductance are achieved by setting the lower magnetic film.

SUMMARY OF THE INVENTION

However, with the electronic component module discussed in the above-mentioned Japanese Laid-Open Patent Application No. 2004-274004, the leakage of magnetic flux from the thin-film magnetic device cannot be ignored. That is, when an IC or other such circuit is electrically connected to the wiring, or even if no IC or other such circuit is electrically connected to the wiring, when the circuit is disposed near the wiring, there is the risk that the leaked magnetic flux will go through the wiring and cause the circuit to malfunction.

Therefore, it is an object of the present invention to provide a thin-film magnetic device with which circuit malfunction is adequately prevented, and an electronic component module having this device.

The inventors conducted diligent study aimed at solving the above problem. For example, the inventors considered applying the thin-film magnetic device described in Japanese Patent No. 3135941 as the thin-film magnetic device used in the electronic component module of Japanese Laid-Open Patent Application No. 2004-274004. However, it was found that the above problem cannot be solved merely by applying the thin-film magnetic device of Japanese Patent No. 3135941 as the thin-film magnetic device in Japanese Laid-Open Patent Application No. 2004-274004. In view of this, the inventors conducted further diligent research, and as a result arrived at the present invention upon discovering that the above problem can be solved by using a thin-film magnetic device in which one magnetic film is disposed facing another magnetic film around which a thin-film coil is wound a plurality of times, and adjusting the ratio of the relative magnetic permeabilities of these magnetic films.

Specifically, the present invention is an electronic component module comprising a base having wiring, and a thin-film magnetic device provided to one side of the base, wherein the thin-film magnetic device comprises a first magnetic film disposed facing the base, a second magnetic film disposed on the opposite side of the first magnetic film with respect to the base, and a thin-film coil wound so as to encircle the second magnetic film a plurality of times, wherein the thin-film coil has a plurality of first conductor pattern components provided between the first magnetic film and the second magnetic film, a plurality of second conductor pattern components provided on the opposite side of the second magnetic film with respect to the first magnetic film, and a plurality of connecting conductors that connect the first conductor pattern components and the second conductor pattern components in series, and the relative magnetic permeability ($\mu 2$) of the second magnetic film is greater than the relative magnetic permeability ($\mu 1$) of the first magnetic film.

With this invention, since the relative magnetic permeability ($\mu 2$) of the second magnetic film is greater than the relative magnetic permeability ($\mu 1$) of the first magnetic film, when current flows to the tin-film coil and generates a magnetic field, the magnetic flux density is greater in the second magnetic film and smaller in the first magnetic film. That is, the magnetic flux concentrates in the second magnetic film, and there is less of it in the first magnetic film. As a result, there is less magnetic flux that leaks out past the first magnetic film, the result being a reduction in magnetic flux leakage. Therefore, with the electronic component module pertaining to the present invention, when an IC or other such circuit is electrically connected to the wiring on the base, or even if no circuit is electrically connected to the wiring on the base, when a circuit is disposed near the wiring, leaked magnetic flux can be sufficiently prevented from going through the wiring on the base and causing the circuit to malfunction. Another advantage to the present invention is that DC bias characteristics are enhanced. The inventors believe the likely reason for this to be that the relative magnetic permeability $\mu 1$ of the first magnetic film is lower than the relative magnetic permeability $\mu 2$ of the second magnetic film, and the balance of magnetic energy stored in the first magnetic film and second magnetic film is ideal in terms of inductance.

The present invention is also a thin-film magnetic device comprising a first magnetic film, a second magnetic film disposed facing the first magnetic film, and a thin-film coil wound so as to encircle the second magnetic film a plurality of times, wherein the thin-film coil has a plurality of first conductor pattern components provided between the first magnetic film and the second magnetic film, a plurality of second conductor pattern components provided on the opposite side of the second magnetic film with respect to the first magnetic film, and a plurality of connecting conductors that connect the first conductor pattern components and the second conductor pattern components in series, and the relative magnetic permeability of the second magnetic film is greater than the relative magnetic permeability of the first magnetic film.

With this invention, since the relative magnetic permeability ($\mu 2$) of the second magnetic film is greater than the relative magnetic permeability ($\mu 1$) of the first magnetic film, when current flows to the thin-film coil and generates a magnetic field, the magnetic flux density is greater in the second magnetic film and smaller in the first magnetic film. That is, the magnetic flux concentrates in the second magnetic film, and there is less of it in the first magnetic film. As a result, there is less magnetic flux that leaks out past the first magnetic film, the result being a reduction in magnetic flux leakage. Therefore, when the thin-film magnetic device of the present invention is integrated with a base in which an IC or other such circuit is electrically connected to the wiring, or, even if integrated with a base in which no circuit is electrically connected to the wiring, when a circuit is disposed near the wiring, for example, leaked magnetic flux can be sufficiently prevented from going through the wiring on the base and causing the circuit to malfunction. In the positional relationship between the IC or other circuit and the thin-film magnetic device of the present invention, it is particularly effective when this circuit is disposed at a location overlapping the first magnetic film on the side opposite to the second magnetic film. Another advantage to the present invention is that DC bias characteristics are enhanced. The inventors believe the likely reason for this to be that the relative magnetic permeability $\mu 1$ of the first magnetic film is lower than the relative magnetic permeability $\mu 2$ of the second magnetic film, and the balance of magnetic energy stored in the first magnetic film and second magnetic film is ideal in terms of inductance.

With the above-mentioned electronic component module or thin-film magnetic device, it is preferable if the thickness (d2) of the second magnetic film is greater than the thickness (d1) of the first magnetic film. In this case, the DC bias characteristics will be better than when the second magnetic film thickness d2 is less than or equal to the first magnetic film thickness d1.

With the above-mentioned electronic component module or thin-film magnetic device, it is preferable if the resistivity ($\rho 2$) of the second magnetic film is greater than the resistivity ($\rho 1$) of the first magnetic film. In this case, less of the magnetic flux leaks beyond the first magnetic film. Therefore, with the electronic component module of the present invention, leakage of magnetic flux beyond the first magnetic film is reduced better than when the resistivity $\rho 2$ of the second magnetic film is less than or equal to the resistivity $\rho 1$ of the first magnetic film.

With the above-mentioned electronic component module or thin-film magnetic device, it is preferable if the saturated magnetic flux density (Bs1) of the first magnetic film is greater than the saturated magnetic flux density (Bs2) of the second magnetic film. In this case, less of the magnetic flux leaks beyond the first magnetic film. Therefore, with the electronic component module of the present invention, leakage of magnetic flux beyond the first magnetic film is reduced better than when the saturated magnetic flux density (Bs1) of the first magnetic film is less than or equal to the saturated magnetic flux density (Bs2) of the second magnetic film.

The term "relative magnetic permeability" as used in the present invention refers to a value measured by shielded loop method. The "shielded loop method" referred to here involves using a microstrip conductor having a characteristic impedance of 50Ω, terminated at a standard resistance of 50Ω, as a detecting coil, and measuring the change in the relative magnetic permeability of a magnetic film placed within the detecting coil, as the change in inductance at the detecting coil. Measurement precision here can be improved by blocking off the microstrip conductor of the detecting coil by sandwiching it between a pair of conductor plates.

The present invention provides an electronic component module with which malfunction of a circuit can be sufficiently prevented.

DESCRIPTION OF THE PREFERRED EMBODIMENTS

Figure 1:
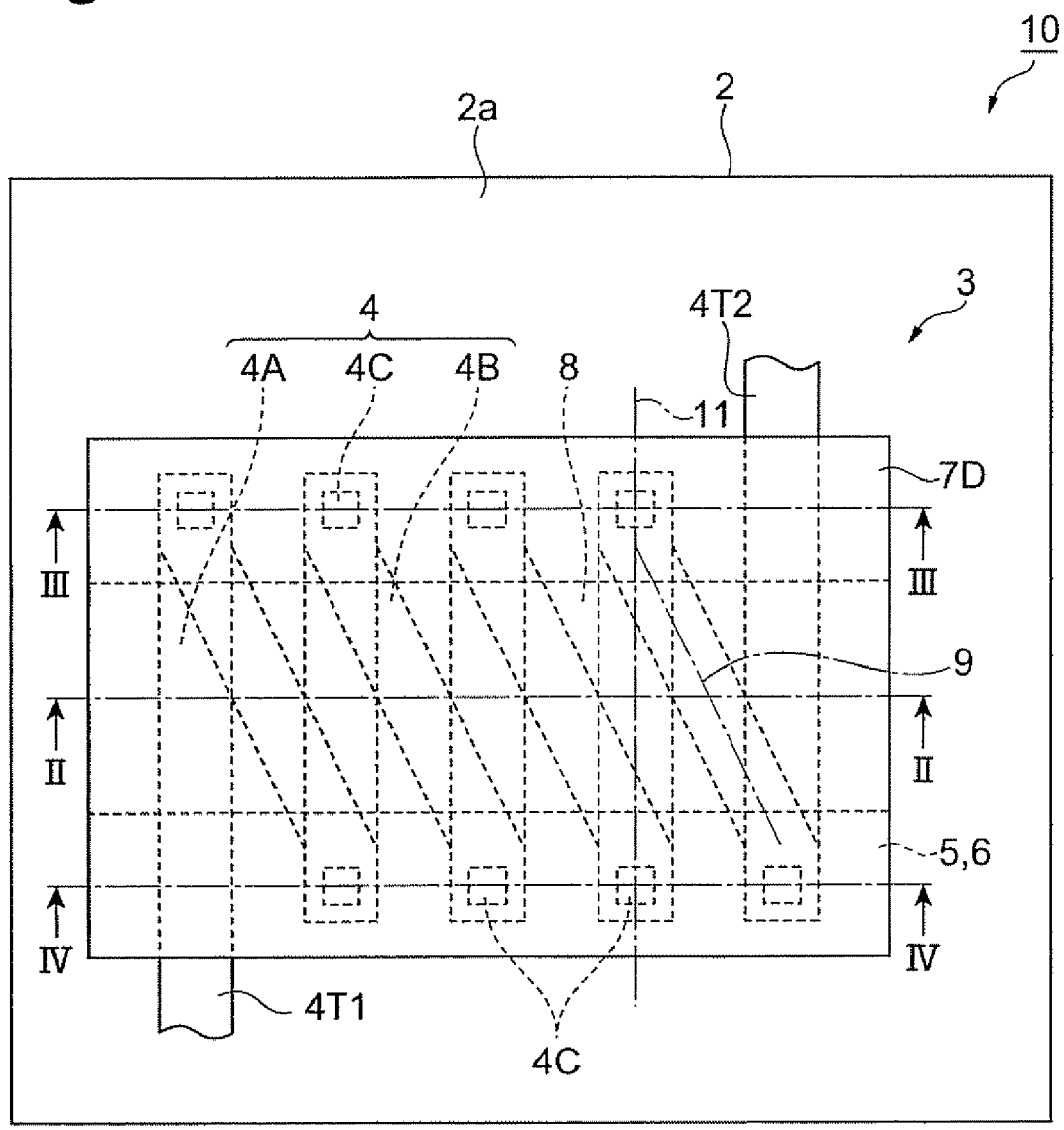
FIG. 1 is a plan view of the electronic component module pertaining to a first embodiment of the present invention.

Embodiments of the present invention will now be described in detail through reference to the appended drawings. Components that are the same in the drawings are all numbered the same, and redundant description will be omitted.

Figure 2:
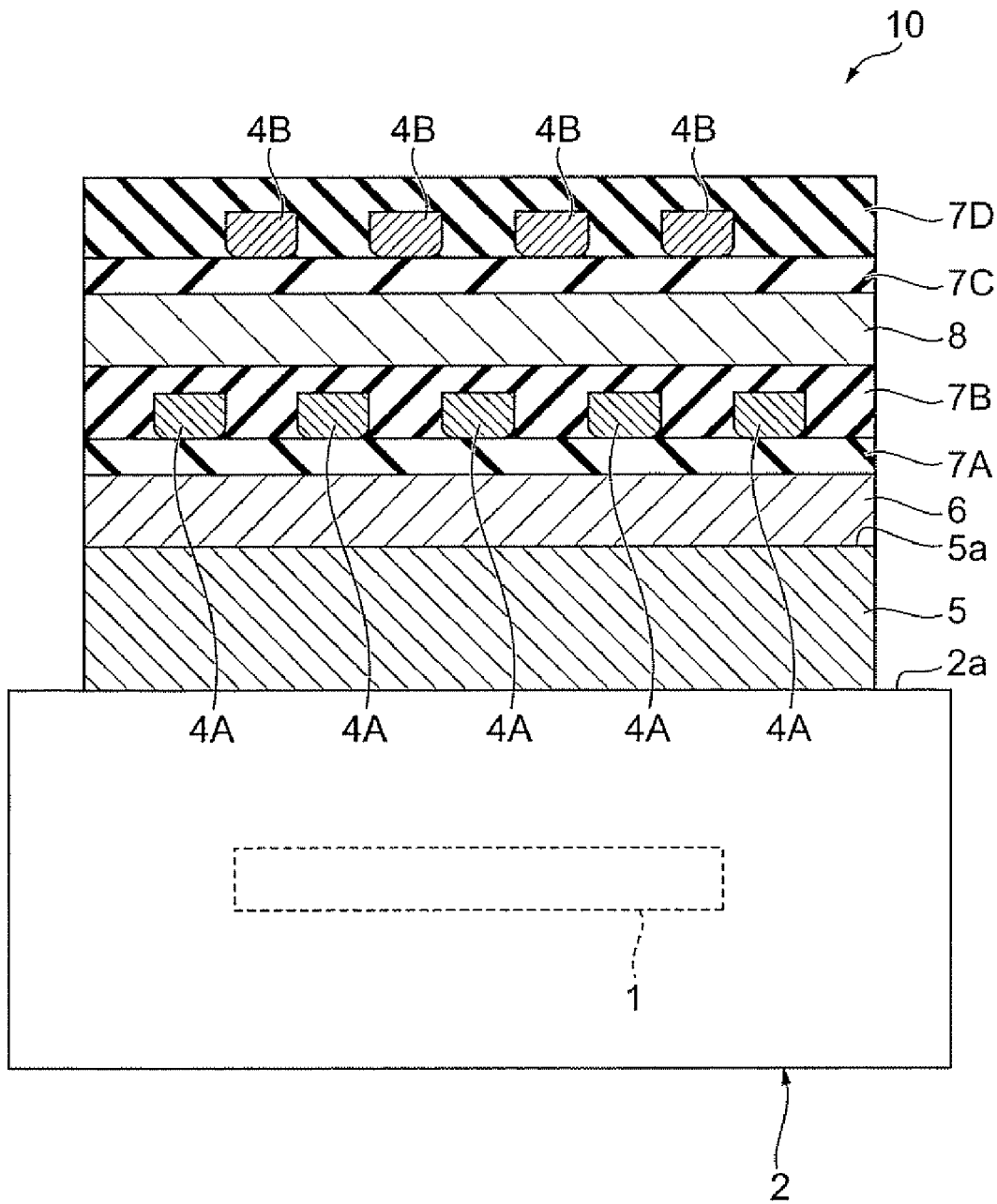
FIG. 2 is a front view partially cut-away along the II-II line in FIG. 1.
Figure 3:
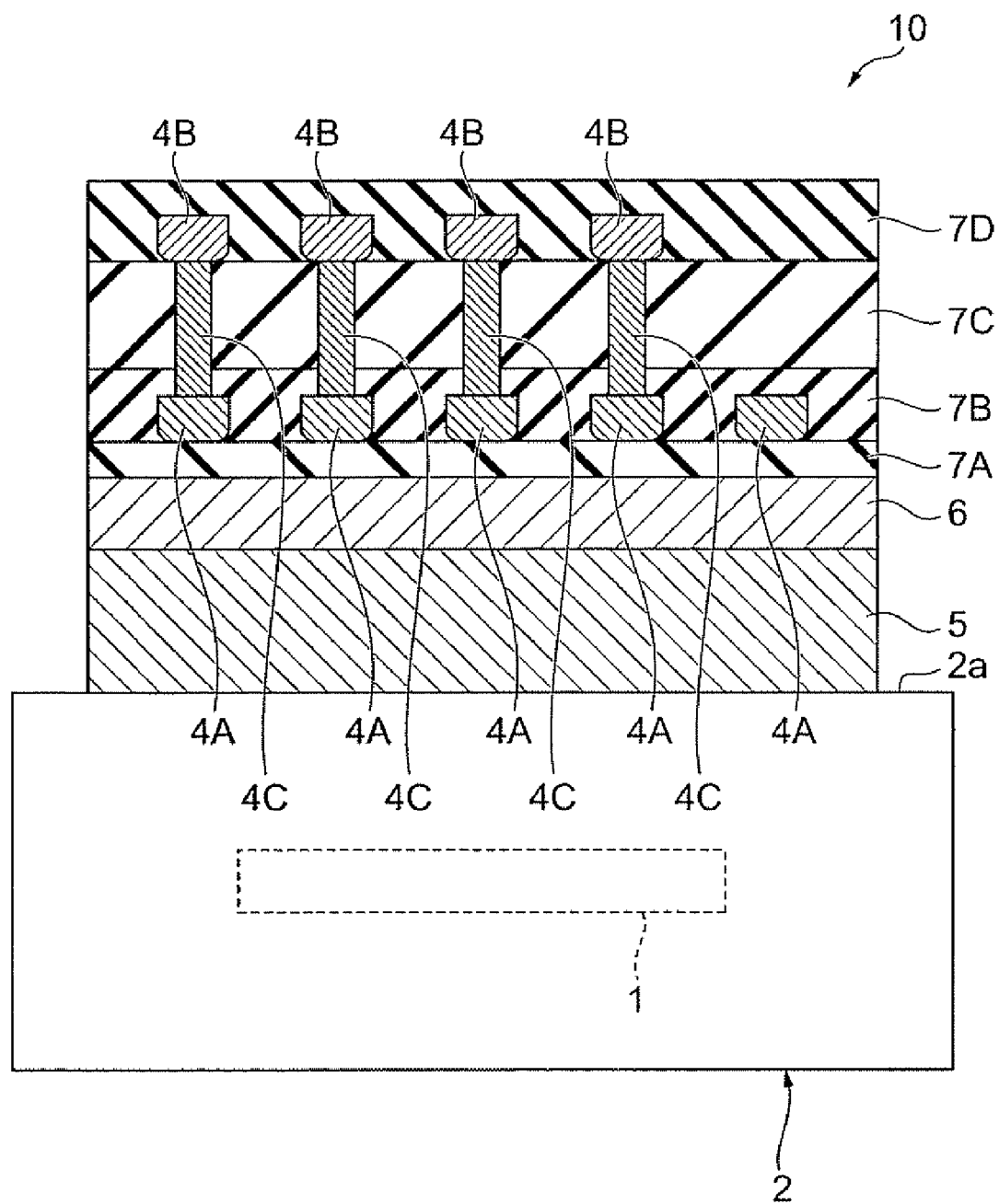
FIG. 3 is a front view partially cut-away along the III-III line in FIG. 1.
Figure 4:
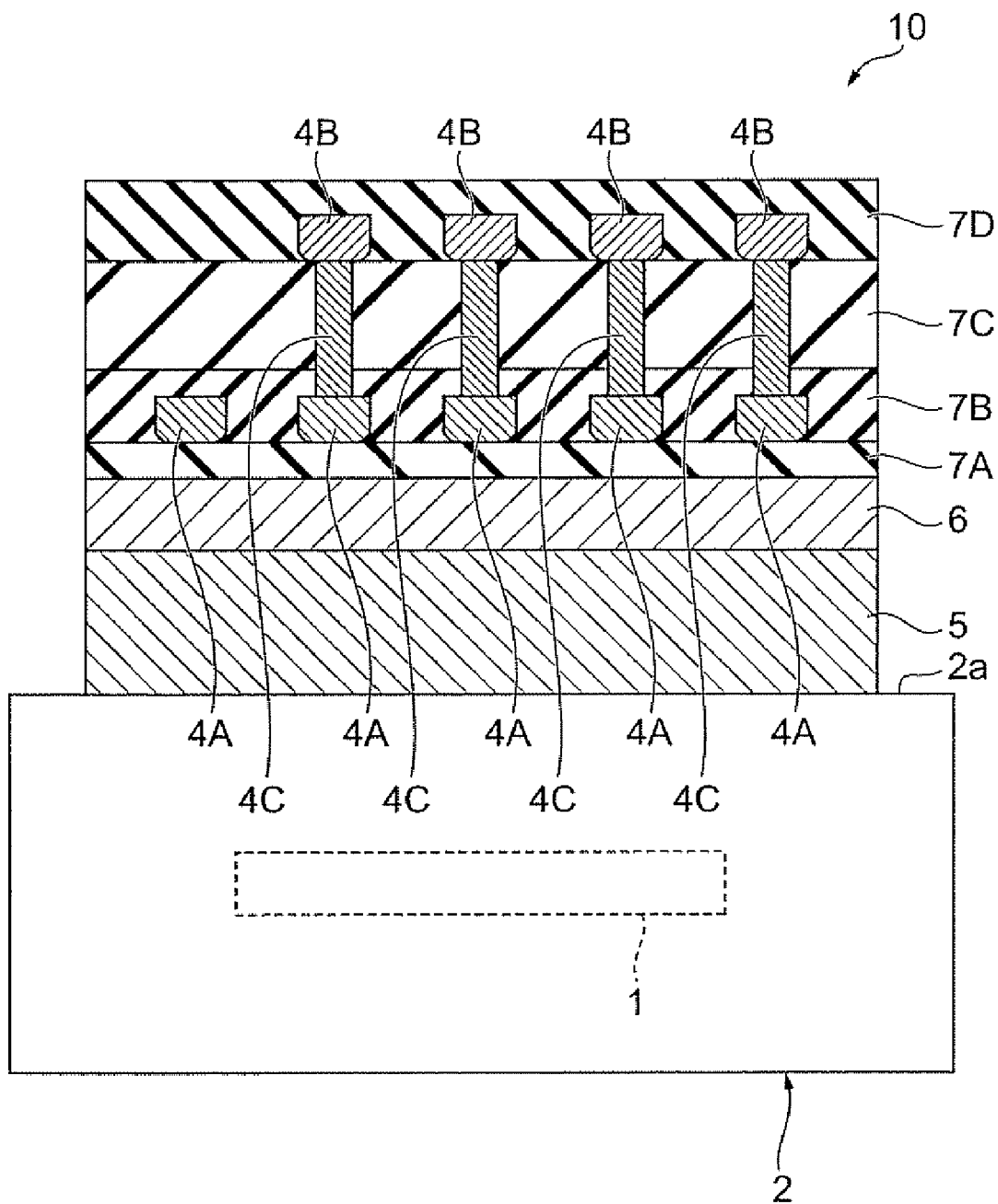
FIG. 4 is a front view partially cut-away along the IV-IV line in FIG. 1.

FIG. 1 is a plan view of the electronic component module pertaining to an embodiment of the present invention. FIG. 2 is a front view partially cut-away along the II-II line in FIG. 1. FIG. 3 is a front view partially cut-away along the III-III line in FIG. 1. FIG. 4 is a front view partially cut-away along the IV-IV line in FIG. 1. As shown in FIGS. 1 to 4, the electronic component module 10 comprises a base 2 in the form of a flat board that includes an IC 1, and a thin-film inductor (thin-film magnetic device) 3 provided on a main side 2a of the base 2. A substrate 5 is provided between the thin-film inductor 3 and the base 2. The substrate 5 is connected to the base 2 via a stud bump (not shown), for example.

Figure 5:
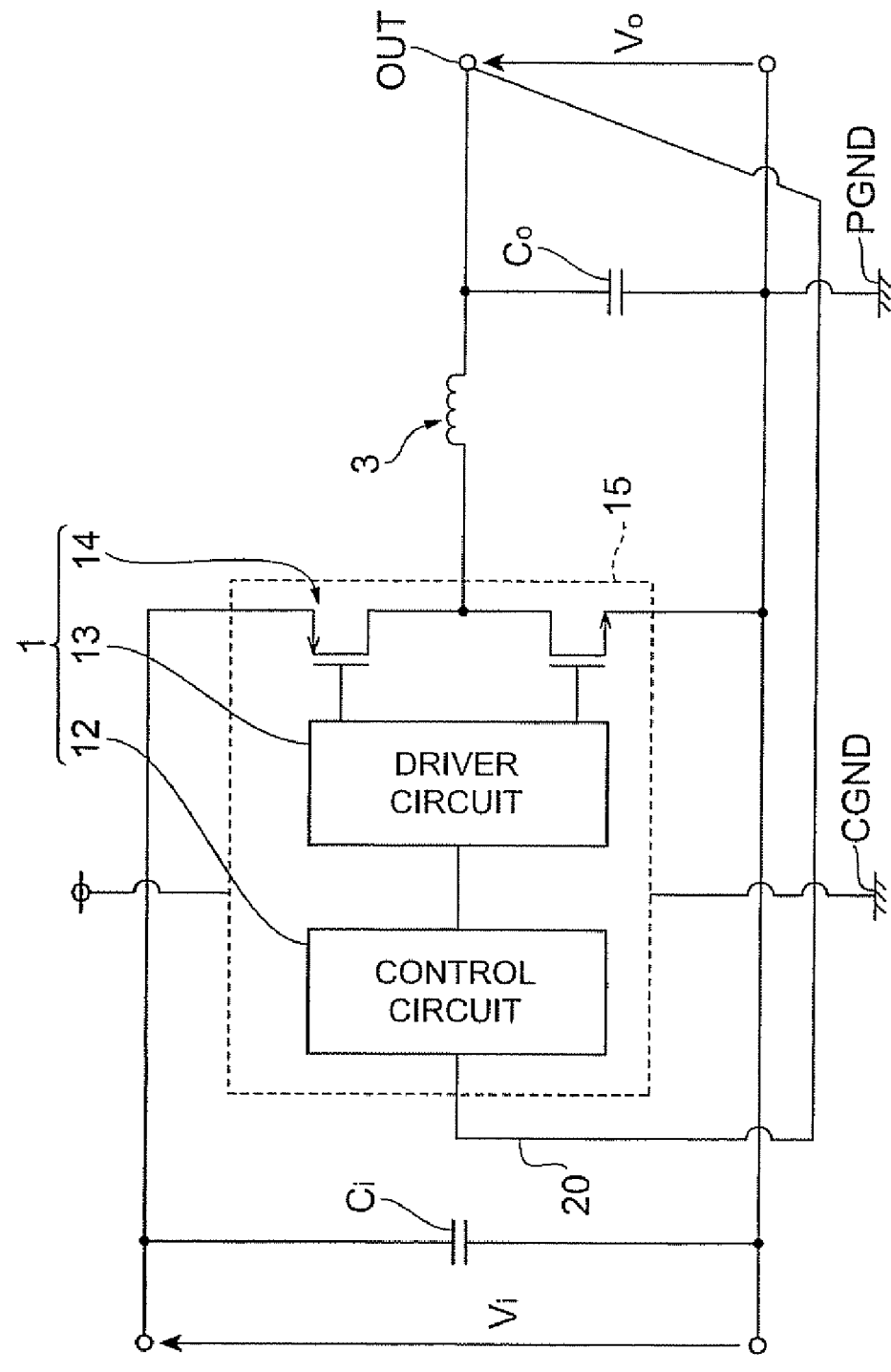
FIG. 5 is a circuit diagram of a DC-DC converter used to evaluate the electronic component modules in Working Examples 1 and 2 and Comparative Examples 1 and 2.

FIG. 5 is a circuit diagram illustrating a DC-DC converter as an example of an electronic component module. As shown in FIG. 5, the DC-DC converter comprises an input capacitor Ci, an output capacitor Co, a control circuit 12, a MOSFET 14, a driver circuit 13 that drives the MOSFET 14, and so forth.

Here, the base 2 is constituted by the portion excluding the thin-film inductor 3 as the thin-film magnetic device. A power supply IC constituted by the control circuit 12, the MOSFET 14, and the driver circuit 13 that drives the MOSFET 14 corresponds to the IC 1, and the IC 1 is formed on a semiconductor substrate 15. The IC 1 is electrically connected to wiring 20 on the base 2. The output capacitor Co and the thin-film inductor 3 function as a filter circuit that outputs DC voltage. CGND is a ground terminal for control signals, and PGND is a ground terminal for power.

The thin-film inductor 3 will now be described through reference to FIG. 1. The thin-film inductor 3 is equipped with a solenoid coil 4 as a thin-film coil. The solenoid coil 4 consists of a plurality of lower conductor pattern components (first conductor pattern components) 4A, a plurality of upper conductor pattern components (second conductor pattern components) 4B, and a plurality of connecting conductors 4C that electrically connect 4A and 4B. Leads 4T1 and 4T2 extend from the two lower conductor pattern components 4A located at the ends of the solenoid coil 4. The leads 4T1 and 4T2 serve to electrically connect to other elements, and are also electrically connected to the wiring 20 of the base 2 (see FIG. 5).

As shown in FIGS. 1 to 4, the solenoid coil 4 and the leads 4T1 and 4T2 are provided on the main side 2a of the base 2, and on a main side 5a of the substrate 5. The main side 5a of the substrate 5 is covered with first a lower magnetic film (first magnetic film) 6 and then an insulating resin film 7A. Therefore, the lower magnetic film 6 is disposed facing the base 2 via the substrate 5.

The lower conductor pattern components 4A are provided on the opposite side of the lower magnetic film 6 with respect to the base 2. More specifically, the lower conductor pattern components 4A are formed directly on the flat upper face of the resin film 7A. An insulating resin film 7B that covers the lower conductor pattern components 4A is further provided on the upper face of the resin film 7A.

An upper magnetic film (second magnetic film) 8 and an insulating resin film 7C are formed in that order on the upper face of the resin film 7B. The upper magnetic film 8 is disposed on the opposite side of the lower magnetic film 6 with respect to the base 2.

A plurality of upper conductor pattern components 4B are formed directly on the upper face of the resin film 7C, and are disposed facing the lower conductor pattern components 4A. Therefore, the upper magnetic film 8 is disposed in between the lower conductor pattern components 4A and the upper conductor pattern components 4B. An insulating resin film 7D that covers the upper conductor pattern components 4B is further provided on the upper face of the resin film 7C. The lower conductor pattern components 4A and the upper conductor pattern components 4B are electrically connected in series by a plurality of connecting conductors 4C that pass through the resin film 7B and the resin film 7C. Thus, the solenoid coil 4 is wound so as to encircle the upper magnetic film 8 a plurality of times. Here, the solenoid coil 4 is wound in a direction along the main side 2a of the base 2. The above-mentioned resin films 7A to 7D are provided to insulate the solenoid coil 4 from the upper magnetic film 8 and the lower magnetic film 6, but can be omitted if the lower magnetic film 6 or the upper magnetic film 8 has an insulating property.

The solenoid coil 4 will now be described in further detail. The lower conductor pattern components 4A and the connecting conductors 4C are, for example, cuboid or cylindrical in shape, and the upper conductor pattern components 4B are cuboid at both ends and have a quadrangular prism-shaped middle part that links these two ends. The ends of the upper conductor pattern components 4B are not limited to being cuboid in shape, and may be cylindrical or some other such shape. Nor is the middle part limited to having a quadrangular prism shape, and may be cylindrical or some other such shape. As shown in FIG. 1, the ends of the upper conductor pattern components 4B extend in a plane parallel to that of the lower conductor pattern components 4A. The center line 9 of the middle part of the upper conductor pattern components 4B is at an angle to the center line 11 of the lower conductor pattern components 4A.

The relative magnetic permeability $\mu2$ of the upper magnetic film 8 is greater than the relative magnetic permeability $\mu1$ of the lower magnetic film 6.

Here, the upper magnetic film 8 and the lower magnetic film 6 are constituted, for example, by an insulating magnetic film such as ferrite or an alloy magnetic film whose main component is a ferromagnetic metal such as iron, nickel, or cobalt, such as CoZrTa, CoZrNb, FeNi, or permalloy. The upper magnetic film 8 and the lower magnetic film 6 have mutually different compositions, or are heat treated at different heat treatment temperatures, so that the relative magnetic permeability $\mu2$ of the upper magnetic film 8 will be greater than the relative magnetic permeability $\mu1$ of the lower magnetic film 6.

In this embodiment, the substrate 5 is composed of glass, the resin films 7A to 7D of polyimide, and the conductor pattern components 4A and 4B, the connecting conductors 4C, and the leads 4T1 and 4T2 of copper. The purpose of the resin films 7A to 7D is to insulate the solenoid coil 4 from the upper magnetic film 8 and the lower magnetic film 6, and instead of polyimide, may be made from $SiO_2$, SiN, or another inorganic film, an epoxy resin containing a metal magnetic powder or ferrite, or the like. When an epoxy resin containing a metal magnetic powder or ferrite is used as the resin films 7A to 7D, the inductance of the thin-film inductor 3 can be increased.

As shown in FIG. 2, with the electronic component module 10, because the relative magnetic permeability $\mu2$ of the upper magnetic film 8 is greater than the relative magnetic permeability $\mu1$ of the lower magnetic film 6, when current flows to the solenoid coil 4 and generates a magnetic field, the magnetic flux density is greater in the upper magnetic film 8 and smaller in the lower magnetic film 6. That is, the magnetic flux concentrates in the upper magnetic film 8, and there is less of it in the lower magnetic film 6. As a result, there is less magnetic flux that leaks out past the lower magnetic film 6, the result being a reduction in magnetic flux leakage. Therefore, with the electronic component module 10 pertaining to this embodiment, leaked magnetic flux from the solenoid coil 4 can be sufficiently prevented from going through the wiring on the base 2 and causing the IC 1 to malfunction. Also, with the electronic component module 10 pertaining to this embodiment, DC bias characteristics can be enhanced, so when this module is applied to a DC-DC converter or another such power conversion device, the power conversion efficiency can be increased. The inventors believe the likely reason for this to be that the relative magnetic permeability of the lower magnetic film 6 is smaller than that of the upper magnetic film 8 and therefore a good balance of magnetic energy can be stored within the thin-film inductor 3.

Furthermore, with the above-mentioned electronic component module 10, the ratio $\mu1/\mu2$ of the relative magnetic permeability $\mu1$ of the lower magnetic film 6 to the relative magnetic permeability $\mu2$ of the upper magnetic film 8 is preferably from 0.001 to 0.9, and more preferably from 0.2 to 0.6. If $\mu1/\mu2$ is less than 0.001, the magnetic flux generated by the solenoid coil 4 will leak to the base 2 side, which is on the outside of the thin-film inductor 3, and if $\mu1/\mu2$ is greater than 0.9, the magnetic flux will concentrated on the lower magnetic film 6 side, so the magnetic flux cannot be confined within the thin-film inductor 3, and will leak outside of the thin-film inductor 3. When this happens, the problem of increased AC loss increases much more in the lower conductor pattern components 4A (first conductor pattern components) sandwiched between the upper magnetic film 8 and the lower magnetic film 6. Also, the actual values of the relative magnetic permeability of the lower magnetic film 6 and the upper magnetic film 8 are about 100 to 6000 when CoZrTa, for example, is used as the lower magnetic film 6 and the upper magnetic film 8, but the relative magnetic permeability can be freely controlled by adjusting the material composition of the magnetic films and the heat treatment conditions.

Also, with the above-mentioned electronic component module 10, it is preferable if the thickness d2 of the upper magnetic film 8 is greater than the thickness d1 of the lower magnetic film 6. In this case, the DC bias characteristics will be better than when the thickness d2 of the upper magnetic film 8 is less than or equal to the thickness d1 of the lower magnetic film 6, so the power conversion efficiency can be further increased. The inventors believe the likely reason for this to be that making the lower magnetic film 6 thinner than the upper magnetic film 8 affords a more uniform magnetic flux distribution within the upper magnetic film 8 and the within the lower magnetic film 6. However, the thickness d2 of the upper magnetic film 8 may be less than or equal to the thickness d1 of the lower magnetic film 6. Even in this case, malfunction of the IC 1 due to leaked magnetic flux can still be sufficiently prevented. It is also possible to enhance the DC bias characteristics.

The thickness ratio d1/d2 between the thickness d2 of the upper magnetic film 8 and the thickness d1 of the lower magnetic film 6 is preferably from 0.1 to 0.9, and more preferably 0.2 to 0.5. If the thickness ratio d1/d2 is less than 0.1, there will be less deterioration in DC bias characteristics, but there will be more magnetic flux leakage than when the thickness ratio d1/d2 is at least 0.1. Also, if the thickness ratio d1/d2 is greater than 0.9, there will be somewhat less magnetic flux leakage than when the thickness ratio d1/d2 is no more than 0.9, but concentration of the magnetic flux in the lower magnetic film 6 will result in inferior DC bias characteristics. If the thickness ratio d1/d2 is within a range of 0.2 to 0.5, there will be little leakage of magnetic flux from the thin-film inductor 3, the DC bias characteristics will be good, and the thin-film inductor 3 will be favorable.

In general, the inductance is lower when the magnetic films in an inductor are thinner, and such an inductor is effective for a DC-DC converter used at high frequencies, whereas when the magnetic films in an inductor are thicker, inductance is higher, and such an inductor is effective for a DC-DC converter used at low frequencies. Therefore, if the film thickness is controlled as in the present invention, the result will be effective for DC-DC converters of various frequency bands, regardless of whether the converter is to be used at high or low frequencies.

Also, with the above-mentioned electronic component module 10, it is preferable if the resistivity $\rho 2$ of the upper magnetic film 8 is greater than the resistivity $\rho 1$ of the lower magnetic film 6. In this case, less of the magnetic flux leaks beyond the lower magnetic film 6 than when the resistivity $\rho 2$ of the upper magnetic film 8 is less than or equal to the resistivity $\rho 1$ of the lower magnetic film 6. Nevertheless, the resistivity $\rho 2$ of the upper magnetic film 8 may be less than or equal to the resistivity $\rho 1$ of the lower magnetic film 6. Even in this case, the magnetic flux can be sufficiently prevented from leaking out through the wiring of the base 2 and causing the IC 1 to malfunction. It is also possible to enhance the DC bias characteristics.

When, for example, the upper magnetic film 8 is made of CoZrTa and the lower magnetic film 6 is made of permalloy, the actual values of the resistivity $\rho 2$ of the upper magnetic film 8 and the resistivity $\rho 1$ of the lower magnetic film 6 are 100 μΩcm for $\rho 2$ and 36 μΩcm for $\rho 1$, and $\rho 2$ is preferably 2.8 times $\rho 1$.

Next, the method for manufacturing the above-mentioned electronic component module 10 will be described.

First, the substrate 5 is readied. Then, the lower magnetic film 6 is formed over the main side 5a of the substrate 5. The lower magnetic film 6 can be formed, for example, by sputtering or plating. The relative magnetic permeability $\mu 1$ of the lower magnetic film 6 here can be adjusted by adding a heat treatment to the lower magnetic film 6 in a magnetic field, and adjusting the heat treatment temperature. The thickness of the lower magnetic film 6 can be adjusted, for example, by varying the sputtering time. Furthermore, the resistivity of the lower magnetic film 6 can be easily adjusted by adding additives to the materials that make up the lower magnetic film 6, or adjusting the compositional ratio of these constituent materials.

Next, the resin film 7A is formed over the lower magnetic film 6.

A seed layer is then formed over the upper face of the resin film 7A, over which is formed a resist pattern having a shape that is complementary with the lower conductor pattern components 4A. The lower conductor pattern components 4A are then formed by plating the seed layer. After this, the resist pattern is removed, and the seed layer that has been exposed through the gaps between the lower conductor pattern components 4A is removed by wet etching. The lower conductor pattern components 4A are thus formed.

After this, the resin film 7B, the upper magnetic film 8, and the resin film 7C are formed in that order so as to cover the lower conductor pattern components 4A. The upper magnetic film 8 here can be formed by the same method as the lower magnetic film 6, such as sputtering. If the upper magnetic film 8 here is formed by sputtering a material having a different composition from that of the lower magnetic film 6 and that will have a greater relative magnetic permeability than the lower magnetic film 6, then the relative magnetic permeability of the upper magnetic film 8 can be made greater than the relative magnetic permeability of the lower magnetic film 6. The film thickness and resistivity can be adjusted by the same methods as for the lower magnetic film 6.

Next, the upper conductor pattern components 4B are formed over the resin film 7C by the same method as for the lower conductor pattern components 4A. The resin film 7D are then formed so as to cover the upper conductor pattern components 4B. The thin-film inductor 3 is thus completed.

Meanwhile, the base 2 is readied. The base 2 readied here is one that has wiring, and the IC 1 is electrically connected to this wiring. The thin-film inductor 3 is then affixed over the base 2, and the thin-film inductor 3 and the IC 1 on the base 2 are electrically connected. The thin-film inductor 3 is connected to the base 2 here so that the lower magnetic film 6 on the thin-film inductor 3 will be disposed closer to the IC 1 than the upper magnetic film 8. The electronic component module 10 is thus completed.

(Evaluation of Magnetic Flux Leakage by Electromagnetic Field Simulation)

An evaluation of magnetic flux leakage was performed by electromagnetic field simulation on the thin-film inductor pertaining to this embodiment, namely, a thin-film inductor having the configuration shown in FIG. 1. More specifically, in this electromagnetic field simulation, commercially available three-dimensional magnetic field analysis software featuring a finite element method (Maxwell, made by Ansoft) was used, a magnetic thin-film inductor was mounted on an IC, and the amount of magnetic flux density leakage onto the IC was calculated at various relative magnetic permeabilities for the upper magnetic film and lower magnetic film on the magnetic thin-film inductor. The amount of magnetic flux density leakage here was the maximum amount of magnetic flux density leakage that occurred on the IC when a current obtained by superposing AC current of 8 MHz with DC current of 500 mA was applied to the magnetic thin-film inductor.

Also, the following conditions were set for the thin-film inductor that was evaluated. The coil had upper conductor pattern components and lower conductor pattern components with a square cross sectional shape, the line width was 50 μm, the spacing between conductor pattern components was 20 μm, the thickness was 50 μm, the number of solenoid windings was 10, and the gap between the upper conductor pattern components and lower conductor pattern components was 10 μm. The thickness of the magnetic films was set as follows: the thickness of the upper magnetic film was 30 μm, and the thickness of the lower magnetic film was 5 μm. The relative magnetic permeability of the upper magnetic film was set at 1000, while the relative magnetic permeability of the lower magnetic film was set at 1, 100, 200, 500, 750, 900, 1000, 2000, or 5000. The resistivity of the upper magnetic film was set at 100 μΩcm, and the resistivity of the lower magnetic film was set at 100 μΩcm. Table 1 shows the results for the magnetic flux leakage.

TABLE 1

| Relative magnetic permeability (μ1) of upper magnetic film | Relative magnetic permeability (μ2) of lower magnetic film | μ2/μ1 | Magnetic flux leakage (mT) |
|---|---|---|---|
| 1000 | 1 | 0.001 | 2.28 |
| 1000 | 100 | 0.100 | 1.9 |
| 1000 | 200 | 0.200 | 1.74 |
| 1000 | 500 | 0.500 | 1.67 |
| 1000 | 750 | 0.750 | 1.78 |
| 1000 | 900 | 0.900 | 1.89 |
| 1000 | 1000 | 1.000 | 1.95 |
| 1000 | 2000 | 2.000 | 2.29 |
| 1000 | 5000 | 5.000 | 2.73 |

(Evaluation of DC Bias Characteristics by Electromagnetic Field Simulation)

An evaluation of DC bias characteristics was performed by electromagnetic field simulation on a thin-film inductor having the configuration shown in FIG. 1. More specifically, in this electromagnetic field simulation, the same three-dimensional magnetic field analysis software as above was used, and the inductance was calculated when a current obtained by superposing AC current of 8 MHz with DC current of 300 mA was applied to the magnetic thin-film inductor.

Also, the following conditions were set for the thin-film inductor that was evaluated. The coil had upper conductor pattern components and lower conductor pattern components with a square cross sectional shape, the line width was 100 μm, the spacing between conductor pattern components was 20 μm, the thickness was 20 μm, the number of solenoid windings was 20, and the gap between the upper conductor pattern components and lower conductor pattern components was 5 μm. The relative magnetic permeability of the upper magnetic film was set at 1000, the relative magnetic permeability of the lower magnetic film was set at 500, and the thickness of the magnetic films was set as follows: the thickness d1 of the upper magnetic film was 10 μm, and the thickness d2 of the lower magnetic film was 0, 1, 3, 5, 10, or 15 μm. The resistivity of the upper magnetic film was set at 100 μΩcm, and the resistivity of the lower magnetic film was set at 100 μΩcm. Table 2 shows the results for the inductance.

TABLE 2

| Thickness d1 (μm) of upper magnetic film | Thickness d2 (μm) of lower magnetic film | d2/d1 | L (H) at 300 mA |
|---|---|---|---|
| 10 | 15 | 1.5 | $1.119 \times 10^{-6}$ |
| 10 | 10 | 1 | $1.130 \times 10^{-6}$ |
| 10 | 5 | 0.5 | $1.144 \times 10^{-6}$ |
| 10 | 3 | 0.3 | $1.154 \times 10^{-6}$ |
| 10 | 1 | 0.1 | $1.096 \times 10^{-6}$ |
| 10 | 0 | 0 | $9.970 \times 10^{-7}$ |

It can be seen from the results in Table 1 above that the amount of magnetic flux leakage onto the IC can be reduced better when the μ of the lower magnetic film is less than the μ of the upper magnetic film. The reason for this seem to be that the magnetic flux is confined to the upper magnetic film with better balance when the μ of the lower magnetic film is smaller. Also, another result that is clear from the simulation is that the DC bias characteristics are improved more when the μ of the lower magnetic film is smaller.

It can be seen from the results in Table 2 that the inductance value is greater, and the DC bias characteristics are enhanced more, when d2/d1 is 0.1, 0.3, or 0.5.

The present invention is not limited to or by the above embodiments. For example, in the above embodiments, a thin-film inductor having just one solenoid coil 4 was used as the thin-film magnetic device, but the thin-film magnetic device may instead be a thin-film transistor having two or more solenoid coils 4.

Also, in the above embodiments, the substrate 5 was disposed between the thin-film inductor 3 and the base 2, but the substrate 5 may be provided on the opposite side of the thin-film inductor 3 with respect to the base 2. In this case, the resin film 7A is formed over the substrate 5, and over this are formed the lower conductor pattern components 4A, the resin film 7B, the upper magnetic film 8, the resin film 7C, the connecting conductors 4C, the upper conductor pattern components 4B, the resin film 7D, and the lower magnetic film 6, and finally, the lower magnetic film 6 is connected to the base 2.

Furthermore, in the above embodiments, the upper magnetic film 8 and the lower magnetic film 6 had different compositions, but may instead have the same composition. In this case, however, the resin film 7A, the lower conductor pattern components 4A, the resin film 7B, the upper magnetic film 8, the resin film 7C, the upper conductor pattern components 4B, and the resin film 7D are formed in that order over the substrate 5, after which the lower magnetic film 6 is formed over the resin film 7D. The lower magnetic film 6 is then connected to the base 2 including the IC 1. As to the temperature of the heat treatment performed when the upper magnetic film 8 is formed, it must be higher than the heat treatment temperature when the lower magnetic film 6 is formed. This is because when the upper magnetic film 8 and the lower magnetic film 6 have the same composition, raising the heat treatment temperature allows μ to be increased, as long as the heat treatment is not performed at a temperature so high as to degrade the characteristics of the films.

Furthermore, in the above embodiments, the IC 1 was disposed facing the lower magnetic film 6, but the IC 1 may be electrically connected to the base 2 by wiring even if not disposed at a location facing the lower magnetic film 6.

Furthermore, in the above embodiments, the IC 1 was electrically connected to the wiring 20 on the base 2 (see FIG. 5), but a capacitor, inductor, or other such circuit may be used in place of the IC 1.

Also, in the above embodiments, the IC 1 was electrically connected to the wiring 20 on the base 2, but the IC 1 need not be electrically connected to the wiring 20. Here again, when the IC 1 is disposed in the vicinity of the wiring, malfunction of the IC 1 may occur due to magnetic flux leakage of the lower magnetic film 6, so the present invention can also be applied to a mode such as this.

EXAMPLE

The details of the present invention will now be described in more specific terms by giving working examples and comparative examples.

First, a magnetic thin-film inductor was produced in which μ was different for the upper magnetic film and the lower magnetic film, a power supply IC was mounted on the thin-film inductor thus produced, and the operation of the power supply IC was tested.

Working Example 1

First, a glass substrate was readied as the substrate 5. Then, a polyimide film was formed as the resin film 7A over the main side 5a of the substrate 5.

Next, a seed layer composed of copper was formed over the upper face of the resin film 7A, and a resist pattern having a shape that was complementary with the conductor pattern to be formed was formed over this. The resist pattern here was formed by exposing and developing a positive resist resin. The seed layer was then copper plated to form conductor pattern components. After this, the resist pattern was removed, and then the seed layer exposed through the gaps between the conductor pattern components was removed by wet etching. Conductor pattern components were formed in this way.

After this, a polyimide resin film, a CoZrTa alloy thin film (as a magnetic film), and a resist resin film were formed in that order so as to cover the conductor pattern components. The CoZrTa alloy thin film here was formed by sputtering in a thickness of 1 μm. After this, the substrate on which this CoZrTa alloy thin film had been formed was heat treated at 210° C. while being rotated at 100 rpm in a vacuum of $10^{-4}$ Torr and in a magnetic field of 1000 gauss. As a result, the magnetic film had a μ of 1400.

Next, the resin film 7B (a polyimide film) was formed over the entire surface, after which openings for the connecting conductors 4C were formed by exposure and developing, and then the connecting conductors 4C were formed by plating. The upper magnetic film 8 was then formed, after which openings for the connecting conductors 4C were formed by etching, and the connecting conductors 4C were then formed by plating. The polyimide resin film 7C was formed over the entire surface, after which openings for the connecting conductors 4C were formed by exposure and developing, and then the connecting conductors 4C were formed by plating. Conductor pattern components were then formed in the same manner as above. A polyimide resin film was then formed.

Next, a CoZrTa alloy thin film was formed by sputtering in a thickness of 10 μm over the uppermost polyimide resin film. The substrate on which this magnetic film had been formed was heat treated at 205° C. while being rotated at 100 rpm in a vacuum of $10^{-4}$ Torr and in a magnetic field of 1000 gauss. As a result, the upper magnetic film had a μ of 1200. A thin-film inductor was thus obtained in the substrate.

Meanwhile, a non-insulated buck-type switching power supply module (excluding a thin-film inductor) was produced on a printed substrate, with a commercially available capacitor and a power IC having a built-in control circuit and a switching frequency of 4 MHz constituted as in the circuit diagram shown in FIG. 5, and this module was put in a state in which an inductor could be mounted on the IC. Although not shown in FIG. 5, the non-insulated buck-type switching power supply module actually also included diodes, resistors, and so forth.

The thin-film inductor obtained above was then mounted on the IC of this module and electrically connected. The substrate was disposed on the opposite side of the thin-film inductor with respect to the IC of the module. A DC-DC converter was obtained in this way.

Working Example 2

A DC-DC converter was obtained in the same manner as in Working Example 1, except that the heat treatment temperature when forming the magnetic film closer to the substrate was changed from 210° C. to 205° C., the relative magnetic permeability of this magnetic film was 1200, no heat treatment was performed when forming the magnetic film farther away from the substrate, and the relative magnetic permeability of this magnetic film was 600.

Comparative Example 1

A DC-DC converter was obtained in the same manner as in Working Example 1, except that after the final magnetic film had been formed, both magnetic films were heat treated at 205° C. at the same time.

Comparative Example 2

A DC-DC converter was obtained in the same manner as in Working Example 1, except that the heat treatment temperature when forming the magnetic film closer to the substrate was changed from 210° C. to 200° C., and the relative magnetic permeability of this magnetic film was 1100.

DC voltage of 3.7 V was inputted to the input capacitor Ci of each of the DC-DC converters of Working Examples 1 and 2 and Comparative Examples 1 and 2, the MOSFET 14 was switched by signals from the driver circuit 13, and a specific DV output voltage Vo of 2.5 V was outputted. As a result, the DC-DC converters of Working Examples 1 and 2 operated without any problem. In contrast, with the DC-DC converters of Comparative Examples 1 and 2, there was considerable output noise, and the rated value of 500 dBμV could not be satisfied. Because of this, it is believed that in Comparative Examples 1 and 2, the IC malfunctioned due to the effect of a leaked magnetic field, since the leaked magnetic flux from the inductor was so large.

The above confirmed that malfunction of an IC or other such circuit can be sufficiently prevented with the electronic component module and thin-film magnetic device of the present invention.

What is claimed is:

1. An electronic component module, comprising:
a base having wiring; and
a thin-film magnetic device provided to one side of the base, wherein
the thin-film magnetic device comprises:
a first magnetic film disposed facing the base;
a second magnetic film disposed on an opposite side of the first magnetic film with respect to the base; and
a thin-film coil wound so as to encircle the second magnetic film a plurality of times,
the thin-film coil comprises:
a plurality of first conductor pattern components provided between the first magnetic film and the second magnetic film;
a plurality of second conductor pattern components provided on an opposite side of the second magnetic film with respect to the first magnetic film; and
a plurality of connecting conductors that connect the first conductor pattern components and the second conductor pattern components in series, wherein a relative magnetic permeability of the second magnetic film is greater than a relative magnetic permeability of the first magnetic film, and a thickness of the second magnetic film is greater than a thickness of the first magnetic film.

2. The electronic component module according to claim 1, wherein a ratio of the relative magnetic permeability of the first magnetic film to the relative magnetic permeability of the second magnetic film is from 0.001 to 0.9.

3. The electronic component module according to claim 1, wherein a resistivity of the second magnetic film is greater than a resistivity of the first magnetic film.

4. The electronic component module according to claim 1, wherein a saturated magnetic flux density of the first magnetic film is greater than a saturated magnetic flux density of the second magnetic film.

* * * * *